Oct. 22, 1968 J. KEMENY 3,406,578

SHAFT-POSITIONING MECHANISM

Filed July 15, 1966

INVENTOR:
JULIUS KEMENY,

BY Julius J. Zaleski
HIS ATTORNEY.

United States Patent Office 3,406,578

Patented Oct. 22, 1968

3,406,578

SHAFT-POSITIONING MECHANISM

Julius Kemeny, Liverpool, N.Y., assignor to General Electric Company, a corporation of New York Filed July 15, 1966, Ser. No. 565,528
6 Claims. (Cl. 74—10.54)

ABSTRACT OF THE DISCLOSURE

A coarse and fine tuning mechanism comprising a shaft carrying a wheel with a plurality of detents or holes and a first arm member pivoted about a point at one end thereof and beyond the periphery of the wheel. The other end of the first arm member includes a slot which traps a ball bearing in each of the detents. A coarse tuning knob is mounted on the shaft for moving various detents into engagement with the ball and a fine tuning knob mounted concentric with the shaft is coupled to the pivot end of the arm through a second arm.

The present invention relates to a shaft positioning mechanism for enabling a rotatable shaft to be positioned in a desired angular range with regard to a reference position by means of one control and a precise position in that range by another control, and relates particularly to a coarse and fine tuning mechanism for the tuning of a television receiver.

The present invention is particularly useful in capacitance tuned circuits for television receivers wherein the capacitance of a variable capacitor is continuously varied over a range by rotation of the rotor thereof to correspondingly vary the frequency range of the tuned circuit to which the variable capacitor is electrically connected. In such an element distinct angular ranges of the shaft correspond to distinct ranges of capacitance of the variable capacitor and also to distinct ranges of frequency of the tuned circuit to which the capacitor is connected. In such an arrangement it is desired to use one control for selecting the desired angular range corresponding to the particular channel desired to be received by the television receiver referred to as a channel selector or coarse tuning, and another control for conveniently varying the position of the shaft in small increments within the range, referred to as a fine or vernier control, for precisely setting the capacitance within that range.

The present invention is directed to providing a simple, low cost, yet highly effective dual control mechanical means, such as described, for accurately positioning a shaft in angular displacement with reference to a predetermined reference position.

In accordance with an illustrative embodiment of the invention there is provided a shaft having a plurality of detents or holes distributed near the periphery thereof and mounted on a support member. There is also provided an arm member having one end pivotally secured to the support member permitting movement of said arm about the pivot point and having at the other end thereof means for resiliently and detachably engaging the detents in the wheel to permit a limited angular movement of said wheel. Means are provided for moving the shaft to cause the arm to engage selectively any one of the detents. Additional means are provided for moving the arm to precisely position the wheel and hence the shaft within the range allowed by the arm and detent combination.

The novel features believed characteristic of the invention are set forth in the appended claims. The invention itself, together with further objects and advantages thereof, may best be understood by reference to the following description taken in connection with the accompanying drawings in which:

Figures 1, 2, 3:
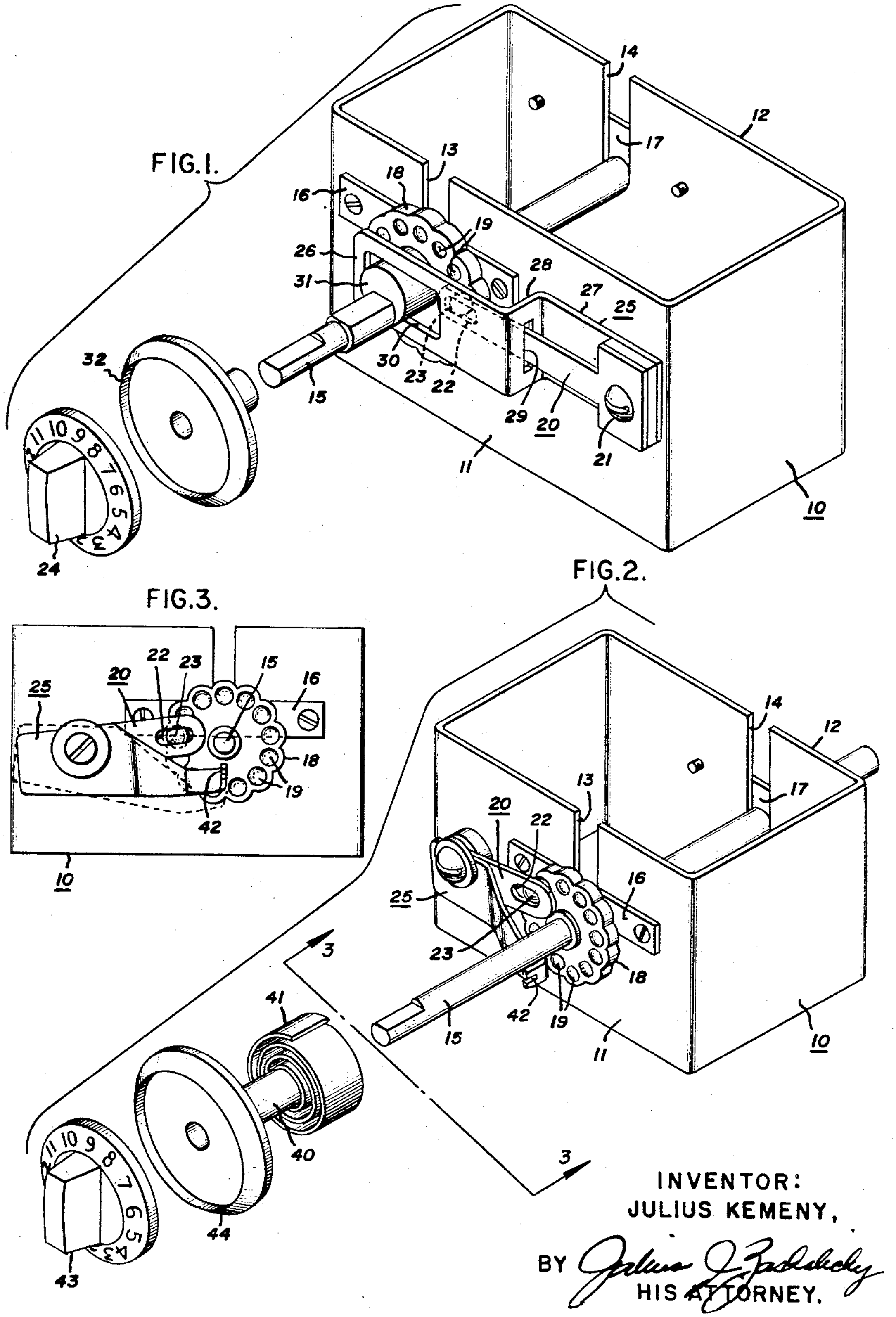
FIGURE 1 is a perspective view partially exploded of an embodiment of the shaft positioning mechanism in accordance with the present invention.
FIGURE 2 shows a perspective view partially exploded of another embodiment of the dual control shaft mechanism in accordance with the present invention.
FIGURE 3 is an end view of the mechanism of FIGURE 2 taken along section 2—2.

Referring now to FIGURE 1 there is shown a housing 10 having front and rear members 11 and 12 and a pair of opposed side members. Each of the front and rear members 11 and 12 have aligned openings 13 and 14, respectively, within the housing respectively aligned and providing bearing surfaces for the shaft 15. On the shaft may be mounted the rotor plates of a capacitor (not shown), the stator plates of which would be mounted to the housing 10. The shaft 15 may be secured in place on the housing by retaining members 16 and 17. On the shaft is fixedly mounted a wheel 18 having distributed along the outer portions of a surface thereof a plurality of detents or holes 19. A generally planar arm member 20 is provided having a hole in one end thereof through which a screw 21 is passed to secure the arm to the housing at a point spaced from the periphery of the wheel 18 so as to permit pivoting of the arm 20 about the axis of the screw. At the other end of the arm member 20 is located an elongated slot 22 with the longer dimension perpendicular to the direction of movement of that end when pivoted about the pivot point, i.e., axis of screw 21. The slot 22 is located adjacent the peripheral surface of the wheel 18 on which the detents 19 are located and encompasses a radial distance of the wheel greater than the radial distance of the detents 19 and a circumferential distance of the wheel comparable to the circumferential distance of the detent. A ball 23 is supported between a detent 19 and the slot 22. Movement of the arm 20 about the pivot point thereof permits the detent 19 and the wheel 18 of which it is a part to move to a limited angular extent about a central position corresponding to the location of the ball 23 in the center of the slot 22. At one extreme of movement the ball 23 bears against the other end of the elongated slot 22. As the arm member 20 is constituted of resilient stock with application of sufficient torque to the shaft 15 to overcome the spring tension of the arm 20, the ball 23 can be moved from one detent to another, each corresponding to a different angular range of movement of the shaft 15. A knob 24 may be secured to the shaft for facilitating the rotation thereof. On the knob equally spaced positions corresponding to the number of detents on the wheel may be provided for setting the angular position of the shaft with respect to an index (not shown). The marks may have numerical designations to represent, for example, the various channels of operation of the television set into which the mechanism may be incorporated.

Another arm member 25 is provided having a pair of generally planar end portions 26 and 27 joined by generally perpendicular portion 28 thereto with an opening 29 therein slightly larger than the lateral dimension of the first arm member 20 which is adapted to be located therein. End 27 of the second arm 25 has a hole therein enabling it to be pivotally mounted or secured at a point about which the first arm member 20 is pivotally mounted. The other end portion 26 of the second arm has an elongated slot or opening 30 thereon with the long dimension thereof perpendicular to the direction which that end moves when the second arm member 25 is pivoted about its pivot point. An eccentric cam member 31 is provided having hole therein for enabling it to be rotatably mounted on the shaft 15. The eccentric cam is porportioned to extend within the elongated opening of the second arm member 25 whereby as the cam member is rotated about the shaft 15 the surface thereof engages the inside surface of the opening 30 to move the second arm member 25 about said pivot point. Motion of the arm member 25 about the pivot point causes an edge of the hole 29 to engage the first arm member 20 to cause motion of the first arm member about the pivot point, thereby moving the detent wheel 18 to an extent permitted by the detent-ball-arm arrangement described above. A knob 32 may be secured to the cam member 31 to facilitate motion of the cam member to effect the vernier or fine positioning of the detent wheel 18.

Referring now to FIGURE 2 there is shown another embodiment of the present invention essentially similar to the embodiment of FIGURE 1 except in regard to the manner of moving in the second or fine control arm member to effect vernier or fine control of the detent wheel. In this figure the parts which are the same as in FIGURE 1 are indicated with the same numerals. In place of the cam member of FIGURE 1 a collar 40 fitting over the shaft is provided. Mounted to the collar and extending radially outward therefrom is provided a spiral spring member 41 formed of generally flat stock with the edge thereof extending in a direction parallel to the axial direction of the shaft 15. One end of the second arm member 25 is pivotally secured about the pivot point and the other end of the second arm member 25 is provided with a recess 42 which engages the edge of the spiral 41. Accordingly, as the collar 40 is moved, the recess 42 and the end member 25 of which it is a part is advanced in a radial direction along the spiral thereby causing a pivoting inward of second arm about the pivot point. Such motion is communicated directly to the first arm 20 to which the second member 25 is secured to effect the fine positioning of the shaft as in FIGURE 1. Knobs 43 and 44 may be secured to shafts 15 and collar 40, respectively, to facilitate movement of these members. The element of FIGURE 2 permits a more precise fine control as the same angular movement of the collar member as with the cam member of FIGURE 1 produces a correspondingly smaller angular movement of the detent arm about the pivot. The spiral member may be constructed to give the desired ratio of movement. Several complete turns of the collar member may be used to produce the limited angular movement of the first arm.

FIGURE 3 shows a side view of FIGURE 2 taken along section 3—3.

The foregoing is a description of illustrative embodiments of the invention, and it is applicant's intention in the appended claims to cover all forms which fall within the scope of the invention.

What I claim as new and desire to secure by Letters Patent of the United States is:

1. A shaft positioning mechanism comprising:
a generally planar frame member,
a shaft rotatably mounted on said frame member with its axis perpendicular to the plane thereof,
a generally planar wheel member fixedly mounted on said shaft member and perpendicular thereto,
an arm member having one end secured to said frame at a point thereof so as to permit said arm member to pivot about said point in said plane generally parallel to the plane of said wheel, the other end of said arm member being in overlying spaced relationship with respect to the periphery of said wheel,
locking means associated wtih said other end of said arm for detachably engaging each of a plurality of matching locking elements distributed in a circle on said wheel member to permit movement of said wheel over a limited range when engaged with one of said elements,
means for moving said shaft to cause said means to detach from one element and engage with another one of said plurality of elements.

2. The combination of claim 1 in which said locking means is so constituted that greater torque is required to move said wheel from one locking means thereon to adjacent locking means than is required to move said wheel while engaged to one of said matching locking means on said arm.

3. A shaft positioning mechanism comprising:
a generally planar frame member,
a shaft rotatably mounted on said frame member with its axis perpendicular to the plane thereof,
a generally planar wheel member fixedly mounted on said shaft member and perpendicular thereto, said wheel member having a plurality of depressions distributed in a circle on one surface thereof and generally of the form of a section of a sphere,
an arm member having one end secured to said frame at a point thereof so as to permit said arm member to pivot about said point in said plane generally parallel to the plane of said wheel, the other end of said arm member having an elongated slot radially oriented,
a spherical ball of dimensions comparable to said sphere and supported on one side by said slot and on the other side by one of said depressions,
said slot being of a predetermined radial extent whereby a predetermined angular movement of said wheel is permitted while said ball is in said one depression,
said arm retaining said ball in said depression with a force such that greater torque is required to move said ball from one depression to another than to move said arm and said wheel with said ball in said one slot,
means for moving said arm about said pivot point,
means for moving said shaft to cause said ball to move from one depression to another one of said depressions.

4. The combination of claim 3 including:
a second arm member rigidly secured to said first arm member and means for independently moving said second arm member to move said first arm member within the range permitted by movement of said ball in said slot.

5. The combination of claim 3 including:
a second arm member having one end rigidly secured to said first arm member and the other end thereof having an opening elongated in the radial direction thereof and encompassing said shaft,
an eccentric cam rotatably mounted on said shaft and in said opening whereby rotation of said cam causes engagement with the elongated edge of said opening to translate a rotational movement thereof of large angular displacement into a rotational movement of said second arm of small angular displacement.

6. The combination of claim 3 including:
a second arm member having one end rigidly secured to said first arm member and pivoted about the pivot point thereof and the other end of which is provided with a recess,
a collar member rotatably mounted on said shaft,
a spiral member rigidly secured to said collar and extending radially outward from said collar,
the recess of said second arm member engaging said spiral member whereby as said collar is rotated said recess moves along said spiral member imparting a rotational movement of said second arm member about said pivot point whereby said first arm member is caused to move about said pivot point.

References Cited

UNITED STATES PATENTS

| | | | |
|---|---|---|---|
| 2,604,791 | 7/1952 | Daly | 74—10.41 |
| 2,981,838 | 4/1961 | Poskozim | 74—10.45 X |
| 3,130,826 | 4/1964 | Davis et al. | 74—10.41 X |
| 3,196,695 | 7/1965 | Dotto | 74—10.41 |
| 3,214,984 | 11/1965 | Wallbrech et al. | 74—10.54 |

FRED C. MATTERN, Jr., *Primary Examiner.*
LEONARD H. GERIN, *Assistant Examiner.*